(12) United States Patent
Hattori et al.

(10) Patent No.: US 8,406,366 B2
(45) Date of Patent: Mar. 26, 2013

(54) SYNCHRONIZATION CIRCUIT, SYNCHRONIZATION METHOD, AND RECEPTION SYSTEM

(75) Inventors: Masayuki Hattori, Kanagawa (JP); Tetsuhiro Futami, Kanagawa (JP); Yuichi Hirayama, Tokyo (JP); Keita Izumi, Tokyo (JP)

(73) Assignee: Sony Corporation, Tokyo (JP)

( * ) Notice: Subject to any disclaimer, the term of this patent is extended or adjusted under 35 U.S.C. 154(b) by 435 days.

(21) Appl. No.: 12/662,669

(22) Filed: Apr. 28, 2010

(65) Prior Publication Data
US 2010/0303186 A1 Dec. 2, 2010

(30) Foreign Application Priority Data
Jun. 1, 2009 (JP) ................................. 2009-132060

(51) Int. Cl.
*H04L 7/00* (2006.01)
(52) U.S. Cl. ........ 375/376; 375/354; 375/375; 375/374; 375/373; 375/371; 375/357
(58) Field of Classification Search .................. 375/354, 375/376, 375, 374, 373, 371, 357
See application file for complete search history.

(56) References Cited

U.S. PATENT DOCUMENTS

| 2003/0119466 A1* | 6/2003 | Goldman ...................... 455/260 |
| 2006/0269032 A1* | 11/2006 | Takahashi ..................... 375/376 |
| 2009/0028017 A1 | 1/2009 | Sano |
| 2012/0076252 A1* | 3/2012 | Futami et al. ................. 375/376 |

FOREIGN PATENT DOCUMENTS
JP 2009-026426 2/2009

OTHER PUBLICATIONS
Extended European Search Report issued Sep. 17, 2010 for corresponding European Application No. 10 00 4804.

* cited by examiner

*Primary Examiner* — Siu Lee
(74) *Attorney, Agent, or Firm* — Rader, Fishman & Grauer PLLC

(57) ABSTRACT

Disclosed herein is a synchronization circuit including: a first phase-locked loop circuit; a second phase-locked loop circuit; a first output circuit; a second output circuit; a first detection circuit; a second detection circuit; and a control circuit.

9 Claims, 10 Drawing Sheets

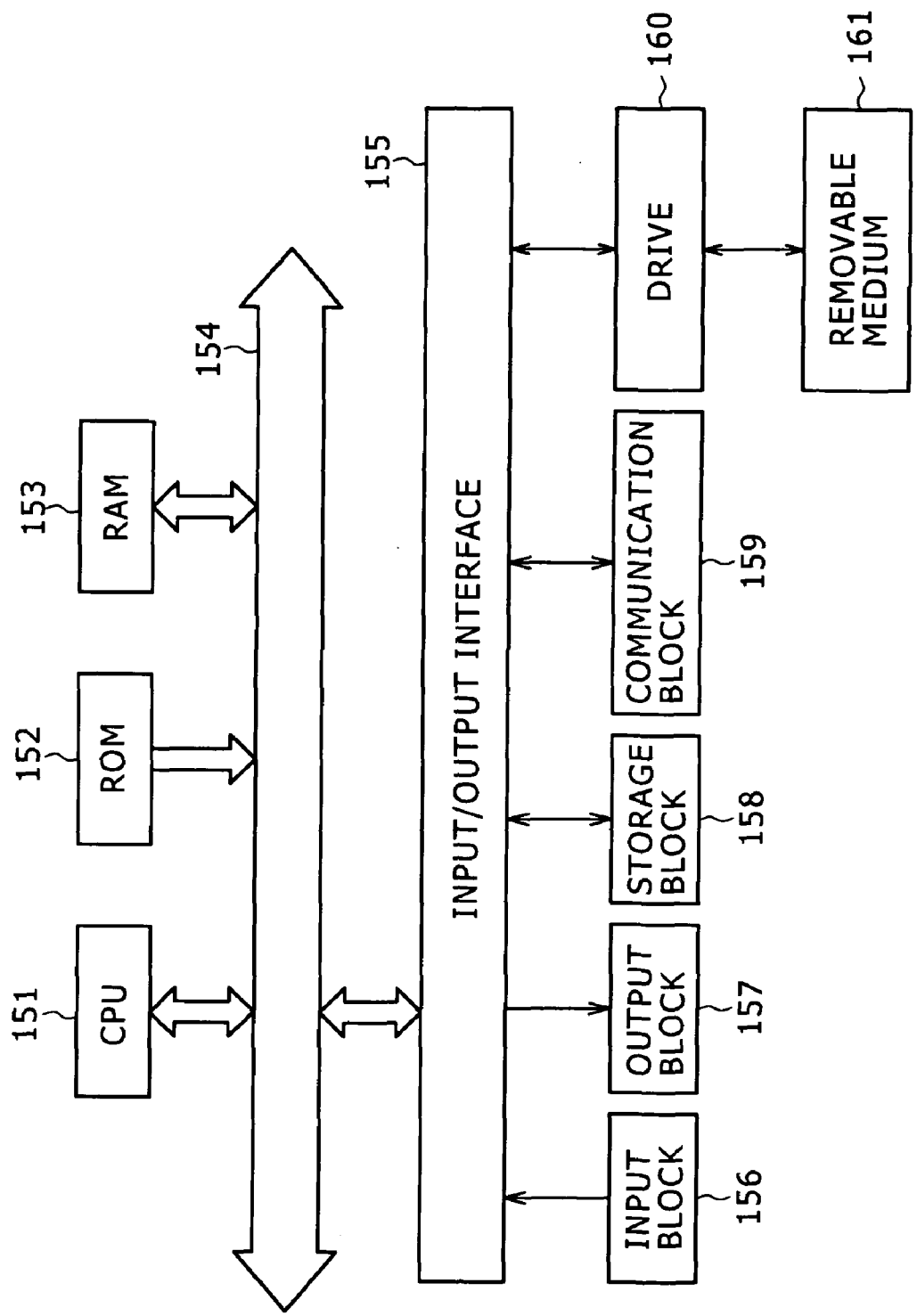

SYNCHRONIZATION CIRCUIT, SYNCHRONIZATION METHOD, AND RECEPTION SYSTEM

BACKGROUND OF THE INVENTION

1. Field of the Invention

The present invention relates to a synchronization circuit, a synchronization method, and a reception system.

More particularly, the invention relates to a synchronization circuit, a synchronization method, and a reception system for enabling an appropriate loop gain to be established in keeping with the individual differences and time jitters characteristic of a particular receiver.

2. Description of the Related Art

Recent years have witnessed phenomenal advances in wireless digital transmission technologies for mobile phone communications, satellite or terrestrial digital broadcasts, and wireless LAN (local area network) communications. With wireless digital transmission systems, it is vitally important to establish stable synchronization with carrier waves and to maintain synchronization with phase and frequency fluctuations subsequent to the establishment of synchronism in order to attain high transmission quality.

To establish and maintain synchronization requires a synchronization circuit which detects highly accurately the differences in phase and frequency between a local oscillator signal generated by a local oscillator of the receiver on the one hand and a signal received thereby on the other hand and which corrects the phase and frequency of the received signal in such a manner as to reduce these differences. PLL (phase-locked loop) circuits are often used as the typical synchronization circuit that establishes synchronization in phase and frequency with the received signal.

FIG. 1 is a schematic view showing a partial structure of an ordinary receiver that includes a frequency/phase synchronization circuit using a digital PLL. As shown in FIG. 1, the receiver includes a radio frequency (RF) circuit 2 and a demodulation circuit 3. A received signal acquired by an antenna 1 having received radio waves is input to a multiplier 2-1 of the RF circuit 2.

The multiplier 2-1 multiplies a local oscillator signal fed from a local oscillator 2-2 by the received signal coming from the antenna 1. The signal resulting from the multiplication is forwarded from the multiplier 2-1 to a low-pass filter (LPF) 2-3.

The local oscillator 2-2 generates the local oscillator signal and sends it to the multiplier 2-1. The LPF 2-3 admits the multiplication signal coming from the multiplier 2-1, and performs a filtering process on the input signal to let pass only the low-frequency component. The filtered signal is output to an A/D (analog/digital) converter 2-4.

It is assumed that $f_c$ stands for the frequency of the received signal having undergone modulation such as PSK (phase shift keying) modulation, $\theta_c$ for the phase of the received signal; $f_0$ for the frequency of the local oscillator signal generated by the local oscillator 2-2, and $\theta_0$ for the phase of the local oscillator signal. The signal output by the LPF 2-3 includes a frequency difference $\Delta f$ corresponding to $f_c - f_0$ and a phase difference $\theta$ corresponding to $\theta_c - \theta_0$.

The A/D converter 2-4 performs analog-to-digital conversion of the signal output from the LPF 2-3. The A/D conversion provides a digital received signal $r_i$ that is fed to the demodulation circuit 3. Reference character "i" denotes the ordinal position of the symbol represented by the received signal. The received signal $r_i$ includes a phase error expressed as $2\pi\Delta f t + \theta$.

FIG. 2 is a schematic view showing a typical structure of an ordinary frequency/phase synchronization circuit which is included in the demodulation circuit 3 of FIG. 1 and which uses a digital PLL. As shown in FIG. 2, the frequency/phase synchronization circuit is made up of a PLL circuit 11 and a multiplier 12. The PLL circuit 11 is constituted by a multiplier 21, a phase error detector 22, a loop filter 23, and a numerical control oscillator (NCO) 24.

The received signal $r_i$ having undergone PSK modulation is input to the multiplier 21 of the PLL circuit 11 and to the multiplier 12. The multiplier 21 of the PLL circuit 11 multiplies the received signal $r_i$ by a phase control amount $e^{-j(2\pi\Delta f t + \theta)}$ supplied from the numerical control oscillator 24. The signal resulting from the multiplication is output to the phase error detector 22.

The phase error detector 22 detects any phase error that may remain in the signal output from the multiplier 21. The detected phase error is output to the loop filter 23.

For example, if the received signal $r_i$ is a signal of a known symbol, the phase error detector 22 detects as the phase error the difference in phase between the symbol of the known symbol and the symbol represented by the output signal coming from the multiplier 21. If the received signal $r_i$ is not a signal of a known symbol, then the phase error detector 22 detects as the phase error, the difference in phase between the actual symbol represented by the output signal from the multiplier 21 and the symbol resulting from a hard decision performed by the multiplier 21.

The loop filter 23 is a proportional integral loop filter. As such, the loop filter 23 filters a phase error detection value output from the phase error detector 22 and outputs the filtered result to the numerical control oscillator 24.

More specifically, a multiplier 23-1 of the loop filter 23 multiplies the phase error detection value fed from the phase error detector 22 by a factor of G1 according to a previously established loop gain G1. The result of the multiplication is output to a multiplier 23-2 and an adder 23-4 in the loop filter 23.

The multiplier 23-2 multiplies the G1-fold phase error detection value fed from the multiplier 23-1 by a factor of G2 according to a previously established loop gain G2, and outputs the result of the multiplication to an integrator 23-3. The multipliers 23-1 and 23-2 are each a weighting multiplier that assigns the weight of the loop gain G1 or G2 to the input signal.

The integrator 23-3 integrates the output of the multiplier 23-2, and outputs the integrated result to the adder 23-4. The adder 23-4 adds up the output of the multiplier 23-1 and that of the integrator 23-3. The resulting sum is output as the filtered result to the numerical control oscillator 24.

Based on the filtered result coming from the loop filter 23, the numerical control oscillator 24 generates the phase control amount $e^{-j(2\pi\Delta f t + \theta)}$ and outputs it to the multipliers 21 and 12. The multiplier 12 multiplies the received signal $r_i$ by the phase control amount $e^{-j(2\pi\Delta f t + \theta)}$ output from the numerical control oscillator 24. The signal resulting from the multiplication is output as a synchronous detection signal $d_i$.

The loop gains G1 and G2 of the loop filter 23 determine the frequency band that is characteristic of the loop filter 23. The frequency band of the loop filter 23 and the performance of the PLL circuit 11 are known to have the following relations therebetween:

The wider the frequency band of the loop filter 23, the higher the capability of the PLL circuit 11 to follow phase error fluctuations and the larger the amount of jitters included in the synchronous detection signal. Conversely, the narrower the frequency band of the loop filter 23, the lower the capability of the PLL circuit 11 to follow phase error fluctuations but the smaller the amount of jitters included in the synchronous detection signal.

Some of the related art is discussed in Japanese Patent Laid-Open No. 2009-26426.

SUMMARY OF THE INVENTION

Actual receivers receiving wireless digital transmissions tend to generate noise in the phase and frequency of the received signal due to individual differences characteristic of the receiver such as temperature dependency of the local oscillator (e.g., local oscillator 2-2 in FIG. 1) and also due to time jitters such as unintended oscillation within the RF circuit (e.g., RF circuit 2 in FIG. 1). To realize the capability to maintain optimal synchronization requires setting an appropriate loop gain in keeping with the individual differences and time jitters characteristic of each receiver.

The loop gain of the PLL circuit for ordinary frequency/phase synchronization circuits is set to a fixed value. This has made it difficult for the ordinary frequency/phase synchronization circuits to provide the capability to maintain optimal synchronization.

The present invention has been made in view of the above circumstances and provides a synchronization circuit, a synchronization method, and a reception system for enabling an appropriate loop gain to be set in keeping with the individual differences and time jitters characteristic of a given receiver.

In carrying out the present invention and according to one embodiment thereof, there is provided a synchronization circuit including: a first PLL circuit configured to output, based on a received signal being input, a first phase control signal representing a phase control amount of the received signal; a second PLL circuit configured to output, given the same input received signal as that input to the first PLL circuit, a second phase control signal representing a phase control amount of the received signal; a first output circuit configured to control the phase of the received signal based on the first phase control signal in order to output a phase-controlled signal; and a second output circuit configured to control the phase of the received signal based on the second phase control signal in order to output a phase-controlled signal. The synchronization circuit further includes: a first detection circuit configured to detect a phase control error of the first PLL circuit based on the phase-controlled signal output from the first output circuit; a second detection circuit configured to detect a phase control error of the second PLL circuit based on the phase-controlled signal output from the second output circuit; and a control circuit configured such that if the phase control error of the first PLL circuit detected by the first detection circuit is larger than the phase control error of the second PLL circuit detected by the second detection circuit, then the control circuit sets the loop gain of a first loop filter included in the first PLL circuit to be the same as the loop gain of a second loop filter included in the second PLL circuit.

Preferably, the first PLL circuit may include: a first detection circuit configured to detect a phase error remaining in the phase-controlled signal; a first loop filter configured to perform a filtering process on the phase error detected by the first detection circuit; a first oscillation circuit configured to output the first phase control signal in accordance with a result of the filtering process performed by the first loop filter; and a first output circuit configured to control the phase of the received signal based on the first phase control signal output from the first oscillation circuit so as to output the phase-controlled signal to the first detection circuit as the signal targeted to be detected for phase error. The second PLL circuit may include: a second detection circuit configured to detect a phase error remaining in the phase-controlled signal; a second loop filter configured to perform a filtering process on the phase error detected by the second detection circuit; a second oscillation circuit configured to output the second phase control signal in accordance with a result of the filtering process performed by the second loop filter; and a second output circuit configured to control the phase of the received signal based on the second phase control signal output from the second oscillation circuit so as to output the phase-controlled signal to the second detection circuit as the signal targeted to be detected for phase error.

Preferably, the first loop filter may include: a first multiplication circuit configured to multiply the phase error detected by the first detection circuit by a first loop gain; a second multiplication circuit configured to multiply the phase error multiplied by the first multiplication circuit by a second loop gain; and a first addition circuit configured to add up the phase error multiplied by the first multiplication circuit and the result of integrating the phase error multiplied by the second multiplication circuit, before outputting the sum of the errors to the first oscillation circuit. The second loop filter may include: a third multiplication circuit configured to multiply the phase error detected by the second detection circuit by a third loop gain; a fourth multiplication circuit configured to multiply the phase error multiplied by the third multiplication circuit by a fourth loop gain; and a second addition circuit configured to add up the phase error multiplied by the third multiplication circuit and the result of integrating the phase error multiplied by the fourth multiplication circuit, before outputting the sum of the errors to the second oscillation circuit.

Preferably, the control circuit may set the first and the third loop gains to a different value each.

According to another embodiment of the present invention, there is provided a synchronization method including the steps of: based on a received signal being input, causing a first PLL circuit to output a first phase control signal representing a phase control amount of the received signal; given the same input received signal as that input to the first PLL circuit, causing a second PLL circuit to output a second phase control signal representing a phase control amount of the received signal; and causing a first output circuit to control the phase of the received signal based on the first phase control signal in order to output a phase-controlled signal. The synchronization method further includes the steps of: causing a second output circuit to control the phase of the received signal based on the second phase control signal in order to output a phase-controlled signal; causing a first detection circuit to detect a phase control error of the first PLL circuit based on the phase-controlled signal output from the first output circuit; causing a second detection circuit to detect a phase control error of the second PLL circuit based on the phase-controlled signal output from the second output circuit; and if the phase control error of the first PLL circuit detected by the first detection circuit is larger than the phase control error of the second PLL circuit detected by the second detection circuit, then setting the loop gain of a first loop filter included in the first PLL circuit to be the same as the loop gain of a second loop filter included in the second PLL circuit.

According to a further embodiment of the present invention, there is provided a reception system including: an acquisition block configured to acquire a signal transmitted over a transmission channel; and a transmission channel decode processing block configured to perform processing including a synchronous detection process on the signal acquired by the acquisition block. In the reception system, the transmission channel decode processing block includes: a first PLL circuit configured to output, based on a received signal being input, a first phase control signal representing a phase control amount of the received signal; a second PLL circuit configured to output, given the same input received signal as that input to the first PLL circuit, a second phase control signal representing a phase control amount of the received signal; and a first output circuit configured to control the phase of the received signal based on the first phase control signal in order to output a phase-controlled signal. The transmission channel decode processing block further includes: a second output circuit configured to control the phase of the received signal based on the second phase control signal in order to output a phase-controlled signal; a first detection circuit configured to detect a phase control error of the first PLL circuit based on the phase-controlled signal output from the first output circuit; a second detection circuit configured to detect a phase control error of the second PLL circuit based on the phase-controlled signal output from the second output circuit; and a control circuit configured such that if the phase control error of the first PLL circuit detected by the first detection circuit is larger than the phase control error of the second PLL circuit detected by the second detection circuit, then the control circuit sets the loop gain of a first loop filter included in the first PLL circuit to be the same as the loop gain of a second loop filter included in the second PLL circuit.

According to an even further embodiment of the present invention, there is provided a reception system including: a transmission channel decode processing block configured to perform processing including a synchronous detection process on a signal acquired over a transmission channel; and an information source decode processing block configured to decode data targeted to be transmitted from the signal processed by the transmission channel decode processing block. In the reception system, the transmission channel decode processing block includes: a first PLL circuit configured to output, based on a received signal being input, a first phase control signal representing a phase control amount of the received signal; a second PLL circuit configured to output, given the same input received signal as that input to the first PLL circuit, a second phase control signal representing a phase control amount of the received signal; and a first output circuit configured to control the phase of the received signal based on the first phase control signal in order to output a phase-controlled signal. The transmission channel decode processing block further includes: a second output circuit configured to control the phase of the received signal based on the second phase control signal in order to output a phase-controlled signal; a first detection circuit configured to detect a phase control error of the first PLL circuit based on the phase-controlled signal output from the first output circuit; a second detection circuit configured to detect a phase control error of the second PLL circuit based on the phase-controlled signal output from the second output circuit; and a control circuit configured such that if the phase control error of the first PLL circuit detected by the first detection circuit is larger than the phase control error of the second PLL circuit detected by the second detection circuit, then the control circuit sets the loop gain of a first loop filter included in the first PLL circuit to be the same as the loop gain of a second loop filter included in the second PLL circuit.

According to a still further embodiment of the present invention, there is provided a reception system including: a transmission channel decode processing block configured to perform processing including a synchronous detection process on a signal acquired over a transmission channel; and an output block configured to output an image or a sound based on the signal processed by the transmission channel decode processing block. In the reception system, the transmission channel decode processing block includes: a first PLL circuit configured to output, based on a received signal being input, first phase control signal representing a phase control amount of the received signal; a second PLL circuit configured to output, given the same input received signal as that input to the first PLL circuit, a second phase control signal representing a phase control amount of the received signal; and a first output circuit configured to control the phase of the received signal based on the first phase control signal in order to output a phase-controlled signal. The transmission channel decode processing block further includes: a second output circuit configured to control the phase of the received signal based on the second phase control signal in order to output a phase-controlled signal; a first detection circuit configured to detect a phase control error of the first PLL circuit based on the phase-controlled signal output from the first output circuit; a second detection circuit configured to detect a phase control error of the second PLL circuit based on the phase-controlled signal output from the second output circuit; and a control circuit configured such that if the phase control error of the first PLL circuit detected by the first detection circuit is larger than the phase control error of the second PLL circuit detected by the second detection circuit, then the control circuit sets the loop gain of a first loop filter included in the first PLL circuit to be the same as the loop gain of a second loop filter included in the second PLL circuit.

According to a yet further embodiment of the present invention, there is provided a reception system including: a transmission channel decode processing block configured to perform processing including a synchronous detection process on a signal acquired over a transmission channel; and a recording block configured to record the signal processed by the transmission channel decode processing block. In the reception system, the transmission channel decode processing block includes: a first PLL circuit configured to output, based on a received signal being input, a first phase control signal representing a phase control amount of the received signal; a second PLL circuit configured to output, given the same input received signal as that input to the first PLL circuit, a second phase control signal representing a phase control amount of the received signal; and a first output circuit configured to control the phase of the received signal based on the first phase control signal in order to output a phase-controlled signal. The transmission channel decode processing block further includes: a second output circuit configured to control the phase of the received signal based on the second phase control signal in order to output a phase-controlled signal; a first detection circuit configured to detect a phase control error of the first PLL circuit based on the phase-controlled signal output from the first output circuit; a second detection circuit configured to detect a phase control error of the second PLL circuit based on the phase-controlled signal output from the second output circuit; and a control circuit configured such that if the phase control error of the first PLL circuit detected by the first detection circuit is larger than the phase control error of the second PLL circuit detected by the second detection circuit, then the control circuit sets the loop gain of a first loop filter included in the first PLL circuit to be the same as the loop gain of a second loop filter included in the second PLL circuit.

According to an embodiment of the present invention embodied as outlined above, the first PLL circuit outputs, based on the received signal being input, the first phase control signal representing the phase control amount of the received signal. The second PLL circuit outputs, given the same input received signal as that input to the first PLL circuit, the second phase control signal representing the phase control amount of the received signal. The first output circuit controls the phase of the received signal based on the first phase control signal in order to output the phase-controlled signal. The second output circuit controls the phase of the received signal based on the second phase control signal in order to output the phase-controlled signal. The first detection circuit detects the phase control error of the first PLL circuit based on the phase-controlled signal output from the first output circuit. The second detection circuit detects the phase control error of the second PLL circuit based on the phase-controlled signal output from the second output circuit. If the phase control error of the first PLL circuit detected by the first detection circuit is larger than the phase control error of the second PLL circuit detected by the second detection circuit, then the control circuit sets the loop gain of the first loop filter included in the first PLL circuit to be the same as the loop gain of the second loop filter included in the second PLL circuit.

Thus the preset invention when suitably embodied allows an appropriate loop gain to be established in keeping with the individual differences and time jitters characteristic of the receiver in use.

BRIEF DESCRIPTION OF THE DRAWINGS

Further advantages of the present invention will become apparent upon a reading of the following description and appended drawings in which:

FIG. 10 is a block diagram showing a typical structure of a computer.

DETAILED DESCRIPTION OF THE PREFERRED EMBODIMENTS

Typical Structure of the Frequency/Phase Synchronization Circuit

Figure 1:
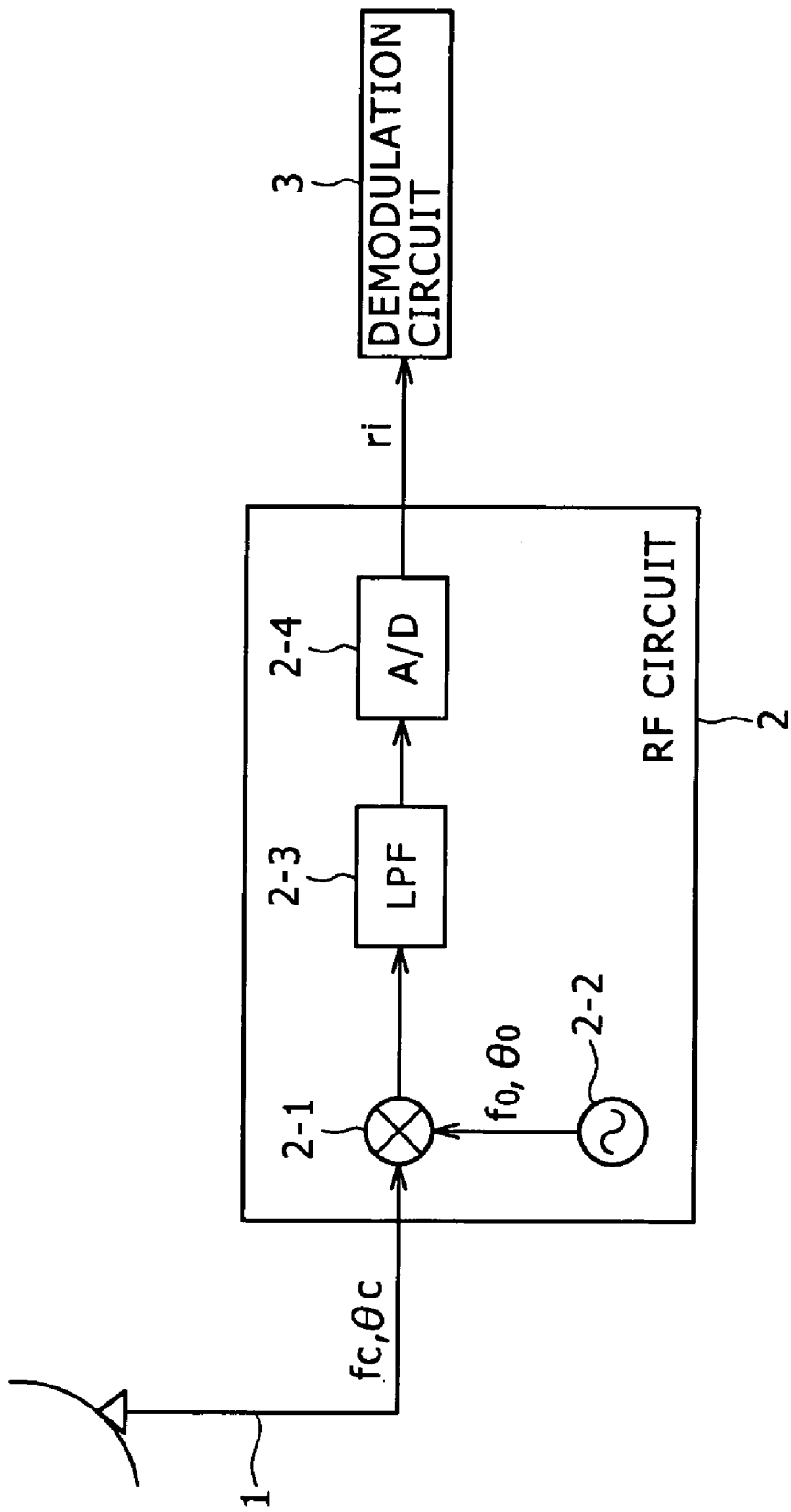
FIG. 1 is a schematic view showing a partial structure of an ordinary receiver.
Figure 3:
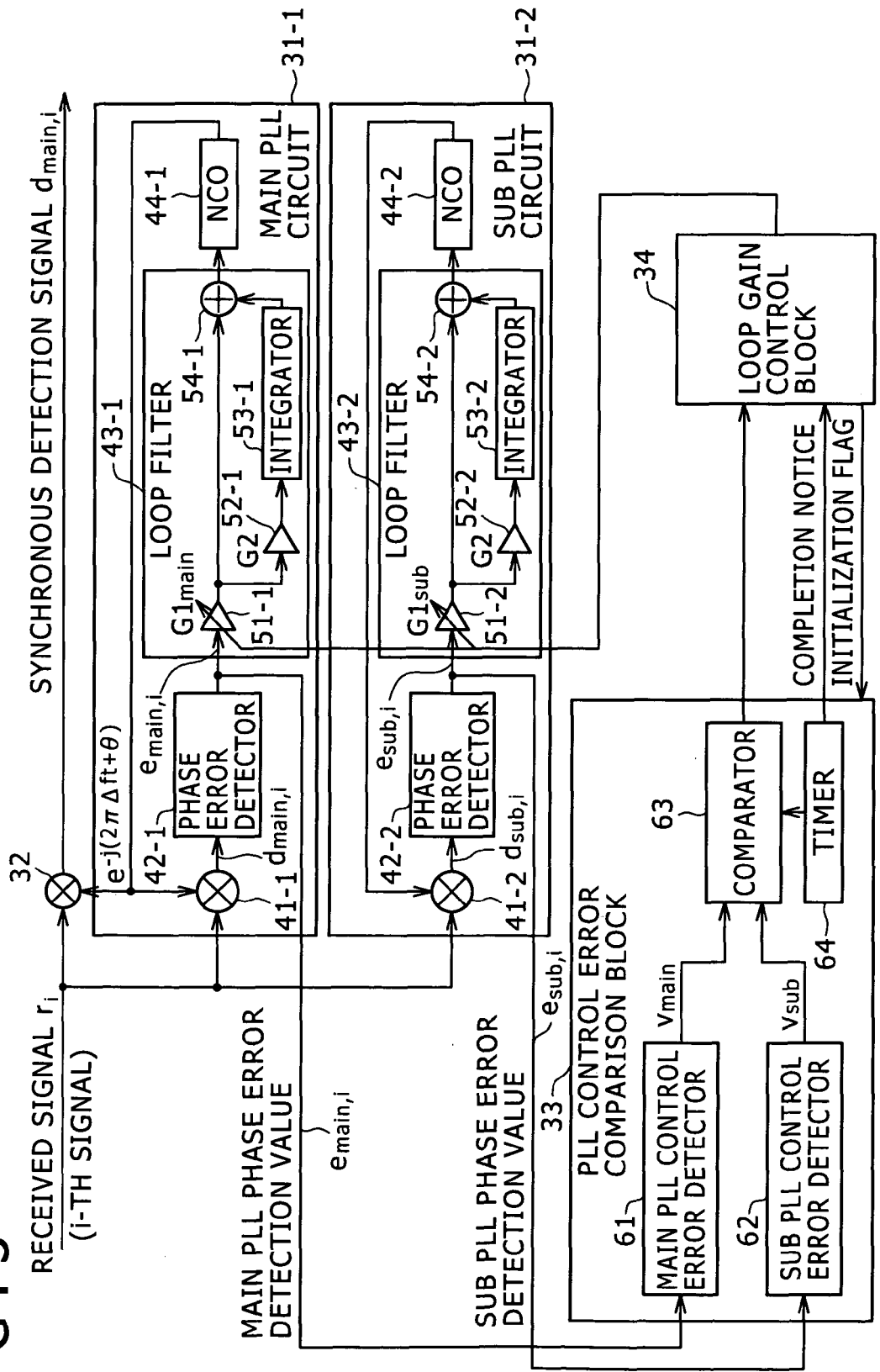
FIG. 3 is a schematic view showing a typical structure of a frequency/phase synchronization circuit as one embodiment of the present invention.

FIG. 3 is a schematic view showing a typical structure of a frequency/phase synchronization circuit as one embodiment of the present invention. The frequency/phase synchronization circuit shown in FIG. 3 is installed in a demodulation circuit of a receiver having the same structure as that shown in FIG. 1.

Figure 2:
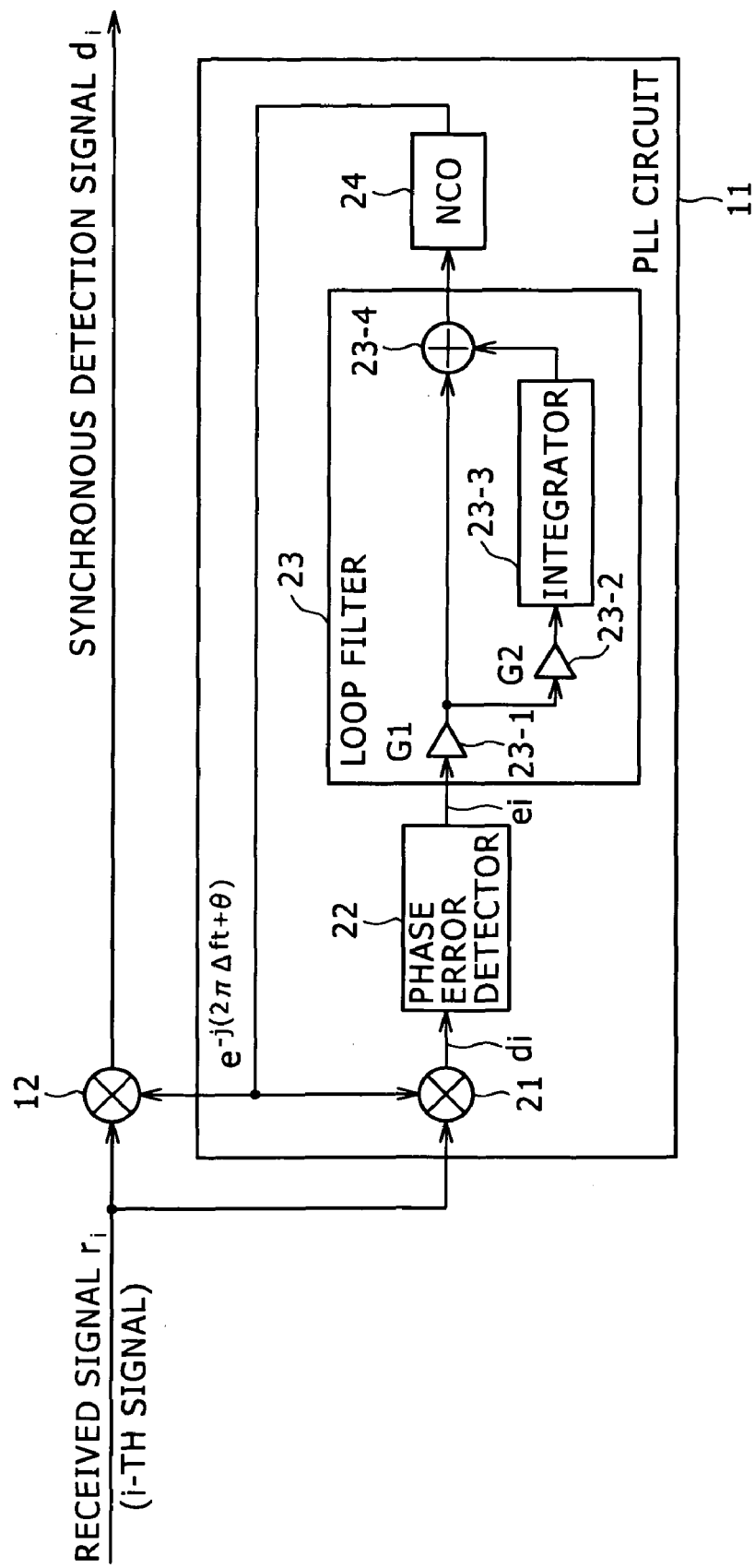
FIG. 2 is a schematic view showing a typical structure of an ordinary frequency/phase synchronization circuit.

The frequency/phase synchronization circuit shown in FIG. 3 is structured differently from the ordinary frequency/phase synchronization circuit in FIG. 2 in three major points: a main PLL circuit and a sub PLL circuit having the same structure are provided to constitute a dual PLL circuit; the loop gain of the loop filter in each of the two PLL circuits is set to be variable; and arrangements for controlling the loop gain settings are additionally provided.

A main PLL circuit 31-1 and a sub PLL circuit 31-2 making up the dual PLL circuit use the same components having the same characteristics and are structured the same way. The same loop gain is set for the loop filter of each of the two PLL circuits. If the same signal is input to the main PLL circuit 31-1 and sub PLL circuit 31-2, then the signals output from the two circuits coincide with each other.

As will be discussed later, the main PLL circuit 31-1 is a circuit that actually performs synchronous detection while the sub PLL circuit 31-2 carries out a "trial" process for determining the loop gain defining the characteristics of the loop filter of the main PLL circuit 31-1.

A received signal $r_i$ as an i-th signal (i.e., of the i-th symbol) is input to a multiplier 41-1 of the main PLL circuit 31-1, to a multiplier 41-2 of the sub PLL circuit 31-2, and to a multiplier 32. The received signal $r_i$ includes the phase error defined as $2\pi\Delta ft+\theta$, as mentioned above.

The multiplier 41-1 of the main PLL circuit 31-1 multiplies the received signal $r_i$ by a phase control amount $e^{-j(2\pi\Delta ft+\theta)}$ fed from a numerical control oscillator 44-1, and sends the signal resulting from the multiplication to a phase error detector 42-1. The signal output from the multiplier 41-1 becomes the same as a synchronous detection signal $d_{main,i}$ which is output from the multiplier 32 as a phase control signal.

The phase error detector 42-1 detects any phase error that may remain in the signal output from the multiplier 41-1, and outputs a main phase error detection value $e_{main,i}$. The phase error detector 42-1 detects the phase error in the same manner as the phase error detector 22 in FIG. 2. The same applies to a phase error detector 42-2 of the sub PLL circuit 31-2, as will be discussed later.

The main phase error detection value $e_{main,i}$ output from the phase error detector 42-1 is supplied to a multiplier 51-1 of a loop filter 43-1 and to a main PLL control error detector 61 of a PLL control error comparison block 33. The loop filter 43-1 is a proportional integral loop filter that performs a filtering process on the main phase error detection value $e_{main,i}$ output from the phase error detector 42-1, and outputs the filtered result to the numerical control oscillator 44-1.

More specifically, the multiplier 51-1 of the loop filter 43-1 multiplies the main phase error detection value $e_{main,i}$ by a factor of $G1_{main}$ according to a loop gain $G1_{main}$ set by a loop gain control block 34. The result of the multiplication is output to a multiplier 52-1 and an adder 54-1.

The multiplier 52-1 further multiplies by a factor of G2 the main phase error detection value $e_{main,i}$ multiplied $G1_{main}$-fold by the multiplier 51-1 and supplied therefrom. The result of the multiplication is output to an integrator 53-1. The integrator 53-1 integrates the output of the multiplier 52-1 and outputs the integrated result to the adder 54-1.

The adder 54-1 adds up the output of the multiplier 51-1 and that of the integrator 53-1. The sum from the addition is output to the numerical control oscillator 44-1 as the filtered result.

The numerical control oscillator 44-1 generates the phase control amount $e^{-j(2\pi\Delta ft+\theta)}$ based on the filtered result coming from the loop filter 43-1. The phase control amount thus generated is output to the multipliers 41-1 and 32.

The multiplier 32 multiplies the received signal $r_i$ by the phase control amount $e^{-j(2\pi\Delta ft+\theta)}$ supplied from the numerical control oscillator 44-1 of the main PLL circuit 31-1. The signal resulting from the multiplication is output as the synchronous detection signal $d_{main,i}$.

In the sub PLL circuit 31-2, the same processes as those discussed above are performed on the same received signal $r_i$ as that input to the main PLL circuit 31-1. That is, the multiplier 41-2 of the sub PLL circuit 31-2 multiplies the received signal $r_i$ by the phase control amount $e^{-j(2\pi\Delta ft+\theta)}$ supplied from a numerical control oscillator 44-2. The signal resulting from the multiplication is output to the phase error detector 42-2.

The phase error detector 42-2 detects any phase error that may remain in the signal output from the multiplier 41-2, and outputs a sub phase error detection value $e_{sub,i}$. The sub phase error detection value $e_{sub,i}$ output from the phase error detector 42-2 is fed to a multiplier 51-2 of a loop filter 43-2 and to a sub PLL control error detector 62 of the PLL control error comparison block 33.

The multiplier 51-2 of the loop filter 43-2 multiplies the sub phase error detection value $e_{sub,i}$ by a factor of $G1_{sub}$ according to a loop gain $G1_{sub}$ set by the loop gain control block 34. The result of the multiplication is output to a multiplier 52-2 and an adder 54-2.

Illustratively, the value set to the multiplier 51-2 as the loop gain $G1_{sub}$ is different from the loop gain $G1_{main}$ set to the multiplier 51-1 of the main PLL circuit 31-1.

The multiplier 52-2 further multiplies by a factor of G2 the sub phase error detection value $e_{sub,i}$ multiplied $G1_{sub}$-fold by the multiplier 51-2 and supplied therefrom. The result of the multiplication is output to an integrator 53-2. Weighting is performed using the same loop gain on the multiplier 52-1 of the main PLL circuit 31-1 and on the multiplier 52-2 of the sub PLL circuit 31-2. The loop gain G2 is a predetermined fixed value.

The integrator 53-2 integrates the output of the multiplier 52-2, and outputs the integrated result to the adder 54-2. The adder 54-2 adds up the output of the multiplier 51-2 and that of the integrator 53-2. The sum from the addition is output to the numerical control oscillator 44-2 as the filtered result.

The numerical control oscillator 44-2 generates the phase control amount $e^{-j(2\pi\Delta ft+\theta)}$ based on the filtered result coming from the loop filter 43-2. The phase control amount thus generated is output to the multiplier 41-2.

The main PLL control error detector 61 of the PLL control error comparison block 33 receives the main phase error detection value $e_{main,i}$ that is detected and supplied by the phase error detector 42-1 of the main PLL circuit 31-1 every time the received signal $r_i$ is input. The main PLL control error detector 61 calculates a variance of the main phase error detection value $e_{main,i}$ based on the main phase error detection value $e_{main,i}$ obtained from the received signals $r_i$ of a predetermined number of symbols. The calculated variance is output as a control error value $v_{main}$ to a comparator 63.

The control error value $v_{main}$ is calculated on the basis of the main phase error detection value $e_{main,i}$ representative of the phase error that remains in the signal phase-controlled by the main PLL circuit 31-1. As such, the control error value $v_{main}$ denotes the error of phase control performed by the main PLL circuit 31-1.

The sub PLL control error detector 62 receives the sub phase error detection value $e_{sub,i}$ that is detected and supplied by the phase error detector 42-2 of the sub PLL circuit 31-2 every time the received signal $r_i$ is input. The sub PLL control error detector 62 calculates a variance of the sub phase error detection value $e_{sub,i}$ based on the sub phase error detection value $e_{sub,i}$ obtained from the received signals $r_i$ of a predetermined number of symbols. The calculated variance is output as a control error value $v_{sub}$ to the comparator 63.

The control error value $v_{sub}$ is calculated on the basis of the sub phase error detection value $e_{sub,i}$ representative of the phase error that remains in the signal phase-controlled by the sub PLL circuit 31-2. As such, the control error value $v_{sub}$ denotes the error of phase control performed by the sub PLL circuit 31-2.

The comparator 63 compares the control error value $v_{main}$ supplied from the main PLL control error detector 61 with the control error value $v_{sub}$ fed from the sub PLL control error detector 62 in order to determine which is the larger. The comparator 63 outputs the result of the comparison to the loop gain control block 34 in response to a comparison result output notice coming from a timer 64.

As described above, the loop filter 43-1 of the main PLL circuit 31-1 and the loop filter 43-2 of the sub PLL circuit 31-2 use the different loop gains $G1_{main}$ and $G1_{sub}$ respectively. It follows that the control error values $v_{main}$ and $v_{sub}$ calculated respectively by the main and sub PLL control error detectors 61 and 62 develop discrepancies reflecting the difference between the loop gains $G1_{main}$ and $G1_{sub}$.

The timer 64 starts counting time in response to an initialization flag supplied from the loop gain control block 34. Upon elapse of a predetermined time period, the timer 34 outputs a comparison completion notice to the loop gain control block 34. The time required to calculate the control error value is set on the timer 64 beforehand, and the counting of the time is carried out by the timer 64. Simultaneously with outputting the comparison completion notice to the loop gain control block 34, the timer 64 outputs a comparison result output notice to the comparator 63.

The loop gain control block 34 incorporates an internal loop gain control sequencer. Using the sequencer, the loop gain control block 34 sets optimal loop gains to the loop filters of the main and sub PLL circuits 31-1 and 31-2 while monitoring operation status of the main and sub PLL circuits 31-1 and 31-2.

Illustratively, if the control error value $v_{main}$ calculated by the main PLL control error detector 61 is found to be larger than the control error value $v_{sub}$ calculated by the sub PLL control error detector 62, the loop gain control block 34 sets the value that is the same as the loop gain $G1_{sub}$ to the loop filter 43-1 of the main PLL circuit 31-1 replacing the latter's currently set loop gain $G1_{main}$.

Where the control error value $v_{main}$ is larger than the control error value $v_{sub}$, it means that synchronization is better maintained with less error by utilizing the loop gain $G1_{sub}$ set to the loop filter 43-2 of the sub PLL circuit 31-2. In this case, the loop gain $G1_{main}$ for the loop filter 43-1 of the main PLL circuit 31-1 is replaced by the loop gain $G1_{sub}$.

If the control error value $v_{sub}$ calculated by the sub PLL control error detector 62 is found to be larger than the control error value $v_{main}$ calculated by the main PLL control error detector 61, then the loop gain control block 34 leaves intact the loop gain $G1_{main}$ for the loop filter 43-1 of the main PLL circuit 31-1 and varies the loop gain $G1_{sub}$ instead.

Where the control error value $v_{sub}$ is larger than the control error value $v_{main}$, it means that synchronization is better maintained with less error if the loop gain $G1_{main}$ is kept being used in place of the loop gain $G1_{sub}$. In this case, the loop gain $G1_{main}$ for the loop filter 43-1 of the main PLL circuit 31-1 is not replaced by the loop gain $G1_{sub}$.

[Operation of the Frequency/Phase Synchronization Circuit]

Figure 4:
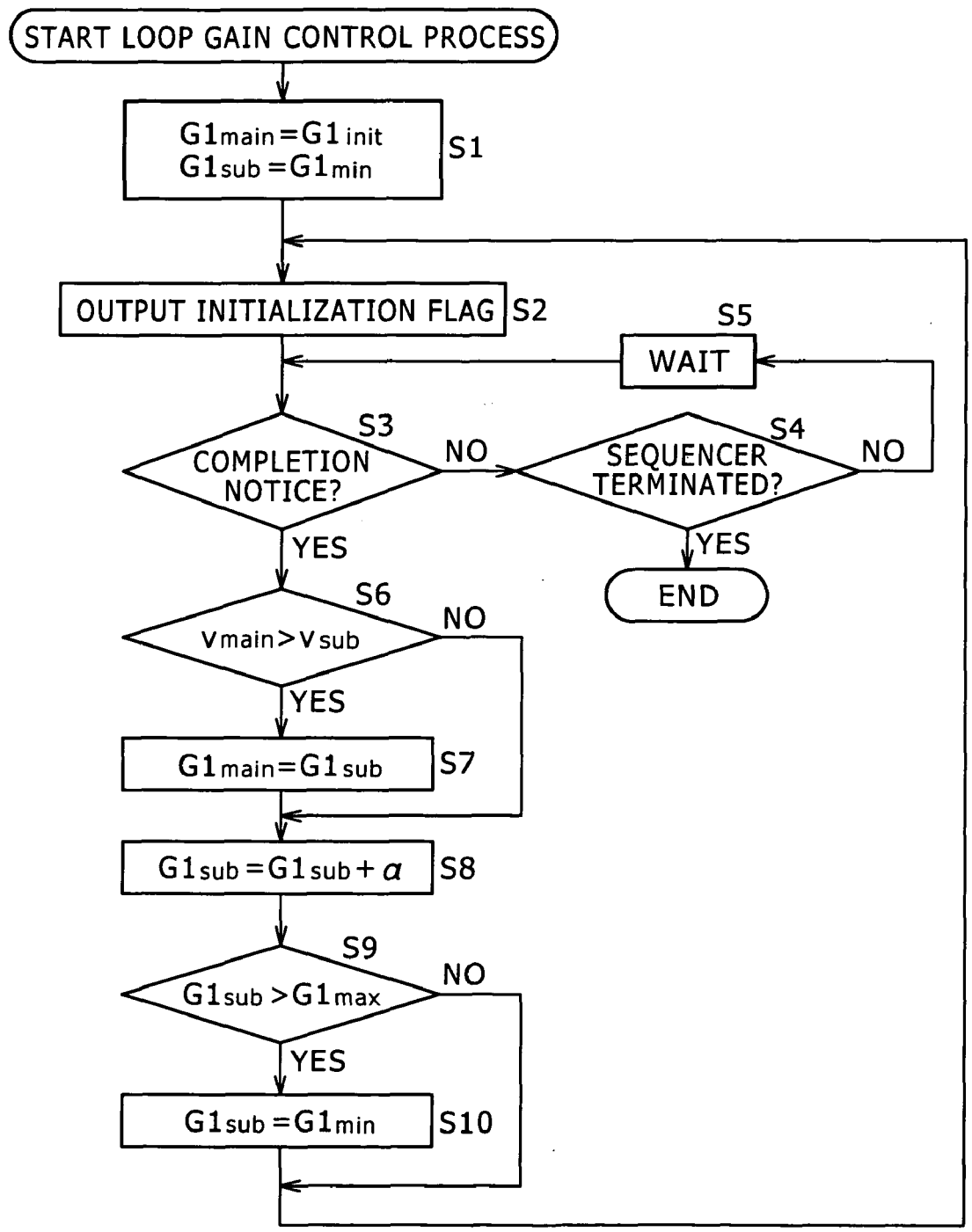
FIG. 4 is a flowchart explanatory of a loop gain control process.

Described below in reference to the flowchart of FIG. 4 is the loop gain control process carried out by the frequency/phase synchronization circuit in FIG. 3. In step S1, the loop gain control block 34 initializes the loop gains by setting a value $G1_{init}$ as the loop gain $G1_{main}$ for the main PLL circuit 31-1 and a value $G1_{min}$ as the loop gain $G1_{sub}$ for the sub PLL circuit 31-2. The value $G1_{init}$ is a predetermined initial value, and the value $G1_{min}$ is a minimum value within the allowable range of settings of $G1_{sub}$.

The main PLL circuit 31-1 performs synchronous detection on the received signal $r_i$ in accordance with the established loop gain $G1_{main}$. In parallel with the synchronous detection carried out by the main PLL circuit 31-1, the sub PLL circuit 31-2 proceeds with its processing based on the loop gain $G1_{sub}$ that is different from the loop gain $G1_{main}$ used by the main PLL circuit 31-1. The main phase error detection value $e_{main,i}$ detected by the main PLL circuit 31-1 and the sub phase error detection value $e_{sub,i}$ detected by the sub PLL circuit 31-2 are fed to the PLL control error comparison block 33.

Step S2 is reached following the loop gain initialization. In step S2, the loop gain control block 34 outputs an initialization flag to the PLL control error comparison block 33. On receiving the initialization flag, the PLL control error comparison block 33 resets the result of the comparison of the most recent control error values as well as the time count on the internal timer.

The main PLL control error detector 61 of the PLL control error comparison block 33 calculates the control error value $v_{main}$ based on the main phase error detection value $e_{main,i}$ detected by the main PLL circuit 31-1. The sub PLL control error detector 62 calculates the control error value $v_{sub}$ based on the sub phase error detection value $e_{sub,i}$ detected by the sub PLL circuit 31-2.

After the reset, the timer 64 starts counting time. Upon elapse of the time period necessary for calculating the control error values $v_{main}$ and $v_{sub}$, the timer 64 outputs a comparison completion notice to the loop gain control block 34. At the same time, the timer 64 outputs a comparison result output command to the comparator 63. In response to the comparison result output command thus fed, the comparator 63 outputs the result of comparing the control error values $v_{main}$ and $v_{sub}$ indicating which is the larger, to the loop gain control block 34.

In step S3, the loop gain control block 34 determines whether the comparison completion notice is supplied from the timer 64. If in step S3 the comparison completion notice is not found to be fed from the timer 64, then step S4 is reached. In step S4, the loop gain control block 34 determines whether the series of steps (i.e., sequencer) is to be terminated.

If in step S4 the sequencer is not determined to be terminated, then step S5 is reached. In step S5, the loop gain control block 34 performs polling at predetermined intervals to detect the completion notice coming from the timer 64.

If in step S3 the comparison completion notice is determined to be supplied, then step S6 is reached. In step S6, the loop gain control block 34 determines whether the control error value $v_{main}$ is larger than the control error value $v_{sub}$ based on the result of the comparison supplied from the comparator 63.

If in step S6 the control error value $v_{main}$ is found to be larger than the control error value $v_{sub}$, then step S7 is reached. In step S7, the loop gain control block 34 replaces the loop gain $G1_{main}$ for the main PLL circuit 31-1 with the loop gain $G1_{sub}$ currently set for the sub PLL circuit 31-2. Because the use of the loop gain $G1_{sub}$ entails less error than the loop gain $G1_{main}$, the loop gain $G1_{sub}$ is set to the main PLL circuit 31-1 replacing the latter's currently established loop gain $G1_{main}$.

If in step S6 the control error value $v_{main}$ is found to be equal to or smaller than the control error value $v_{sub}$ (i.e., not $v_{main} > v_{sub}$), then step S7 is skipped. In step S8, the loop gain control block 34 sets $G1_{sub}+\alpha$ in order to update the loop gain $G1_{sub}$ for the sub PLL circuit 31-2. The value a is a gain amount corresponding to the minimum step obtained by quantizing the loop gain G1 ($G1_{main}$, $G1_{sub}$).

In step S9, the loop gain control block 34 determines whether the updated loop gain $G1_{sub}$ is larger than a maximum value $G1_{max}$ within the allowable range of settings.

If in step S9 the loop gain $G1_{sub}$ is found to be larger than the maximum value $G1_{max}$, step S10 is reached. In step S10, the loop gain control block 34 again sets the minimum value $G1_{min}$ within the allowable range of settings as the loop gain $G1_{sub}$.

If in step S9 the loop gain $G1_{sub}$ is not found to be larger than the maximum value $G1_{max}$, then step S10 is skipped. Step S2 is reached again if in step S9 the loop gain $G1_{sub}$ is not found to be larger than the maximum value $G1_{max}$, or after the minimum value $G1_{min}$ is set in step S10. Thereafter, the subsequent steps are repeated.

If in step S4 the sequencer is determined to be terminated in accordance with a command coming illustratively from a host control block, the loop gain control process is brought to an end.

In the frequency/phase synchronization circuit of FIG. 3, as described above, the main PLL circuit 31-1 performs synchronous detection continuously while the sub PLL circuit 31-2 measures control error values by successively varying the loop gain. Every time the sub PLL circuit 31-2 detects a loop gain that will allow a smaller phase error to be obtained than the loop gain set to the main PLL circuit 31-1, the loop gain of the main PLL circuit 31-1 is replaced by the loop gain of the sub PLL circuit 31-2.

The arrangement above makes it possible automatically to optimize the loop gain to be actually used by the main PLL circuit 31-1 in synchronous detection. As a result, the inventive synchronization circuit permits frequency/phase synchronization with a minimum of degradation in transmission quality free from the individual differences and time jitters characteristic of the receiver in use.

[Variations]

Figure 5:
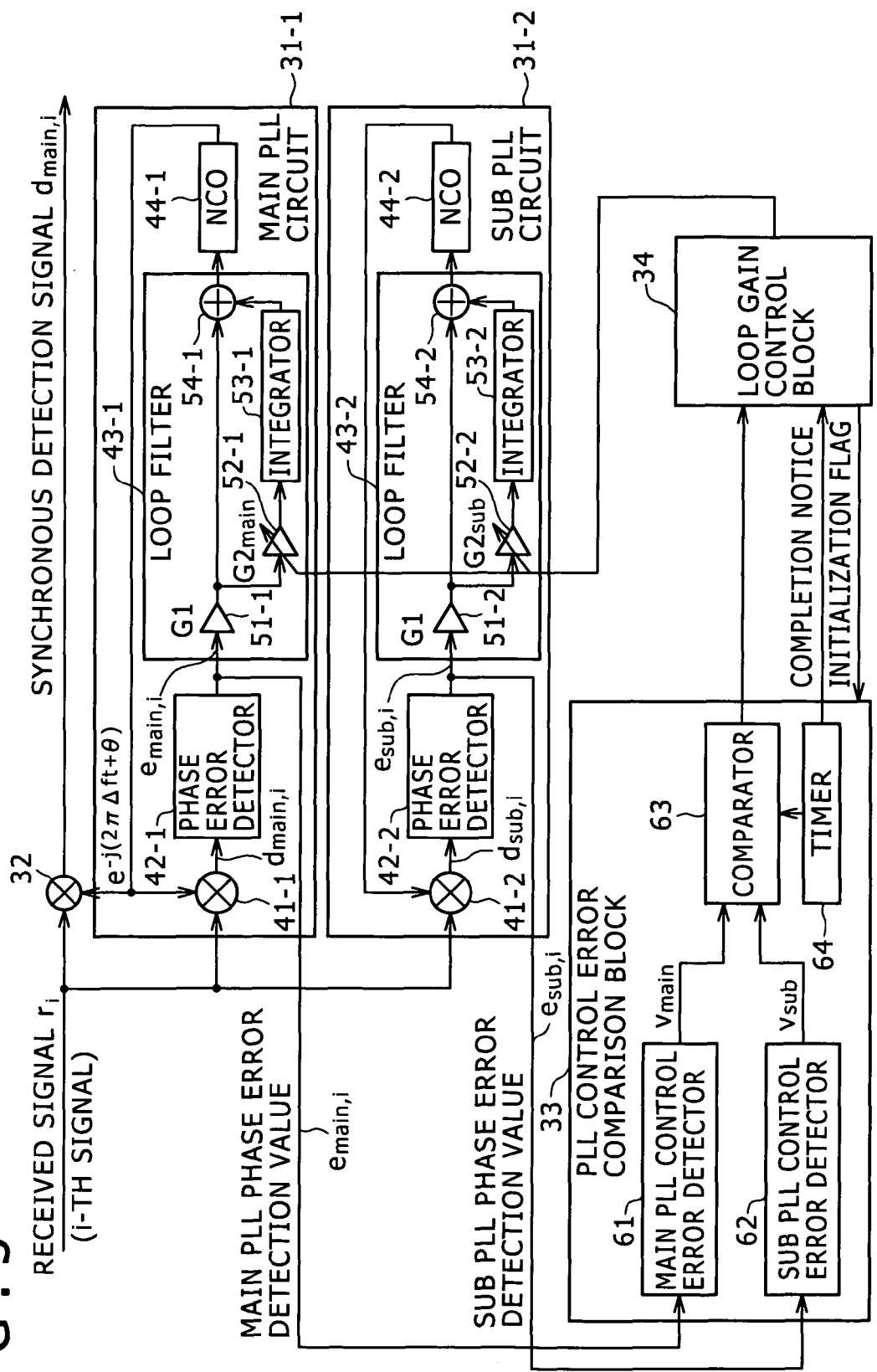
FIG. 5 is a schematic view showing a typical structure of a frequency/phase synchronization circuit as another embodiment of the present invention.

FIG. 5 is a schematic view showing a typical structure of a frequency/phase synchronization circuit as another embodiment of the present invention. As shown in FIG. 5, the loop gain G2 for use in the multiplication of the phase error subsequent to the multiplication using the loop gain G1 may be made variable in place of the loop gain G1 used in the direct multiplication of the detected phase error.

Specifically, the loop gain control block 34 in FIG. 5 controls a loop gain $G2_{main}$ of the main PLL circuit 31-1 and a loop gain $G2_{sub}$ of the sub PLL circuit 31-2 based on the control error values $v_{main}$ and $v_{sub}$. The loop gain $G2_{main}$ is set to the multiplier 52-1 of the main PLL circuit 31-1 and the loop gain $G2_{sub}$ is set to the multiplier 52-2 of the sub PLL circuit 31-2.

If the control error value $v_{main}$ is found to be larger than the control error value $v_{sub}$, the loop gain control block 34 sets the value that is the same as the loop gain $G2_{sub}$ to the loop filter 43-1 of the main PLL circuit 31-1 replacing the latter's currently set loop gain $G2_{main}$.

Figure 6:
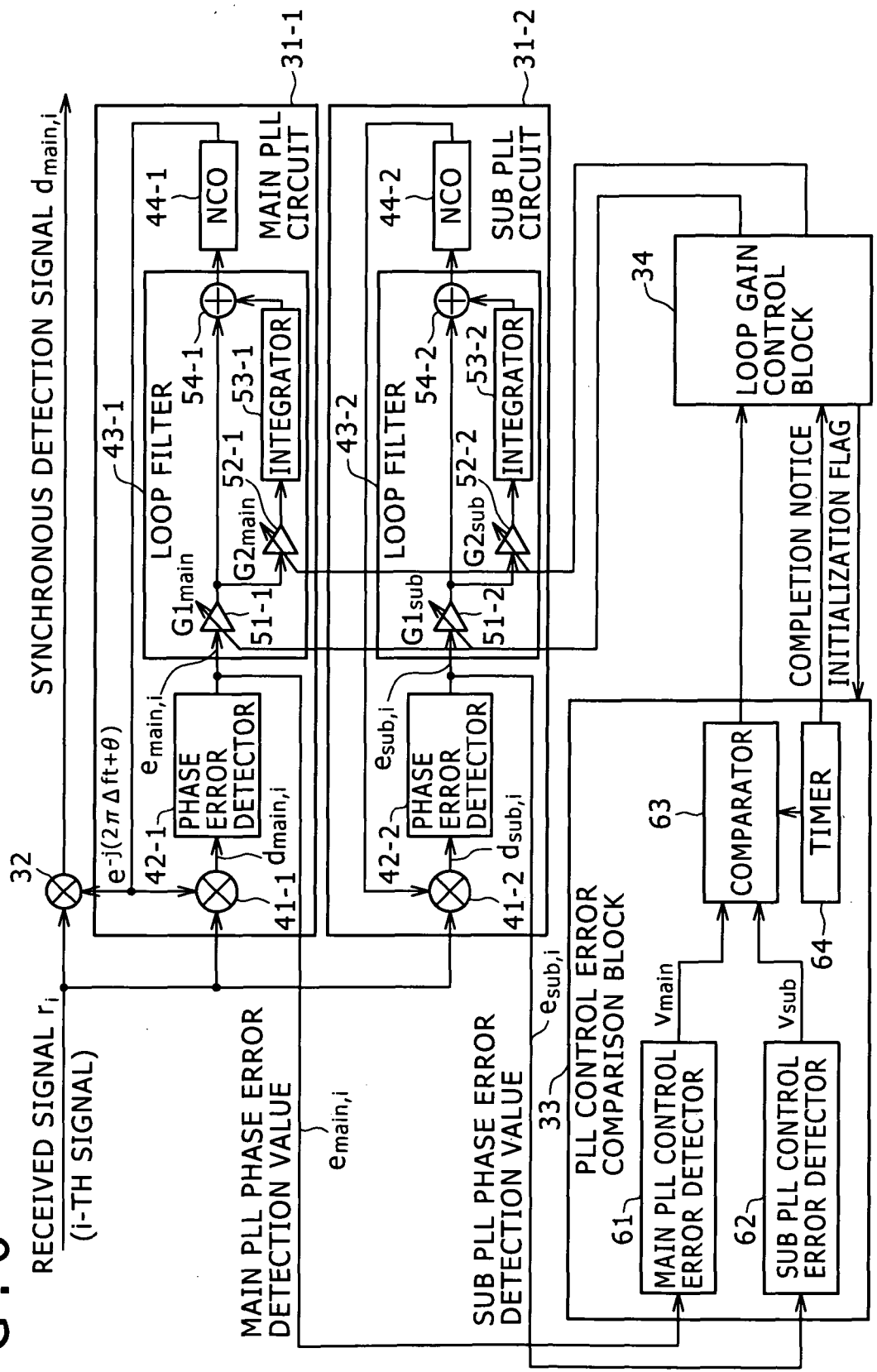
FIG. 6 is a schematic view showing a typical structure of a frequency/phase synchronization circuit as a further embodiment of the present invention.

Alternatively, as shown in FIG. 6, the loop gains G1 and G2 may both be made variable in order to allow the loop filters of the main and sub PLL circuits 31-1 and 31-2 to vary in characteristics. The loop gain control block 34 in FIG. 6 controls the loop gains $G1_{main}$ and $G2_{main}$ of the main PLL circuit 31-1 and the loop gains $G1_{sub}$ and $G2_{sub}$ of the sub PLL circuit 31-2 based on the control error values $v_{main}$ and $v_{sub}$, respectively.

In the foregoing description, the variance of the phase error detection values was shown to be used as the error control value. Alternatively, some other suitable value calculated on the basis of the phase error detection values such as their average may be utilized as the phase error value.

Figure 7:
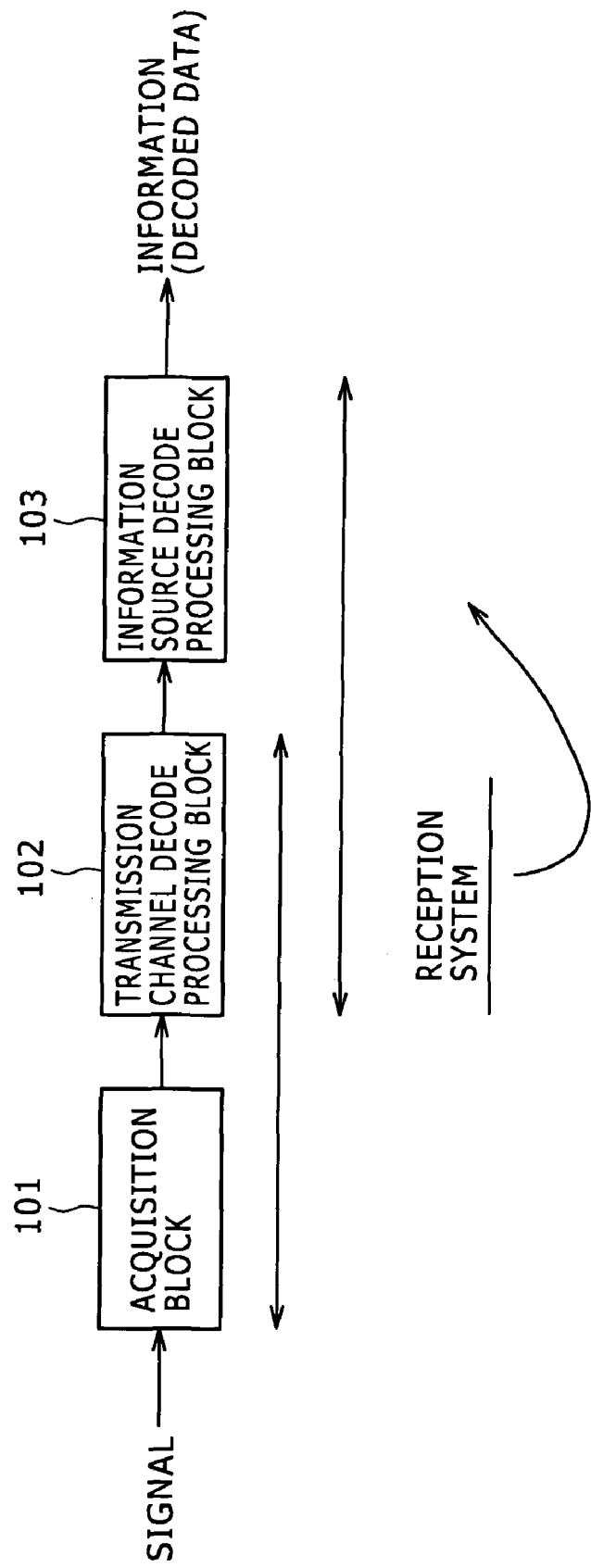
FIG. 7 is a block diagram showing a first structure example of a reception system.

FIG. 7 is a block diagram showing the first structure example of a reception system to which the frequency/phase synchronization circuit of the present invention is applied. The reception system of FIG. 7 is made up of an acquisition block 101, a transmission channel decode processing block 102, and an information source decode processing block 103.

The acquisition block 101 acquires signals over transmission channels such as terrestrial digital broadcasts, satellite digital broadcasts, CATV networks, or the Internet. The signal thus acquired is fed from the acquisition block 101 to the transmission channel decode processing block 102.

The transmission channel decode processing block 102 performs transmission channel decode processing including synchronous detection and error correction on the signal acquired by the acquisition block 101 over the transmission channel, and forwards the processed signal to the information source decode processing block 103. The transmission channel decode processing block 102 contains the frequency/phase synchronization circuit structured as discussed above and shown in FIG. 3 or the like, and this circuit carries out the above-mentioned synchronous detection.

The information source decode processing block 103 performs, on the signal having undergone the transmission channel decode processing upstream, information source decode processing including the process of expanding compressed information back to the original information from which to acquire the data targeted to be transmitted.

That is, the signal acquired by the acquisition block 101 over the transmission channel may have been submitted to compression coding earlier for information compression whereby the amount of video and audio data is reduced. If that is the case, the information source decode processing block 103 carries out, on the signal having undergone the transmission channel decode processing, information source decode processing such as the process of expanding the compressed information back to the original information.

If the signal acquired by the acquisition block 101 over the transmission channel has not been subjected to compression coding, then the information source decode processing block 103 does not perform the process of expanding compressed information back to the original information. Illustratively, the typical expansion process may be MPEG decoding. The information source decode processing may include descrambling in addition to the expansion process.

The reception system of FIG. 7 may be applied illustratively to TV tuners that receive digital TV broadcasts. The acquisition block 101, transmission channel decode processing block 102, and information source decode processing block 103 may each be implemented as an independent device (i.e., as a hardware device such as an IC (integrated circuit) or as a software module).

The three blocks of the acquisition block 101, transmission channel decode processing block 102, and information source decode processing block 103 may be formed into a single independent device. Alternatively, the acquisition block 101 and transmission channel decode processing block 102 may be structured into a single independent device. As another alternative, the transmission channel decode processing block 102 and information source decode processing block 103 may be made into a single independent device.

Figure 8:
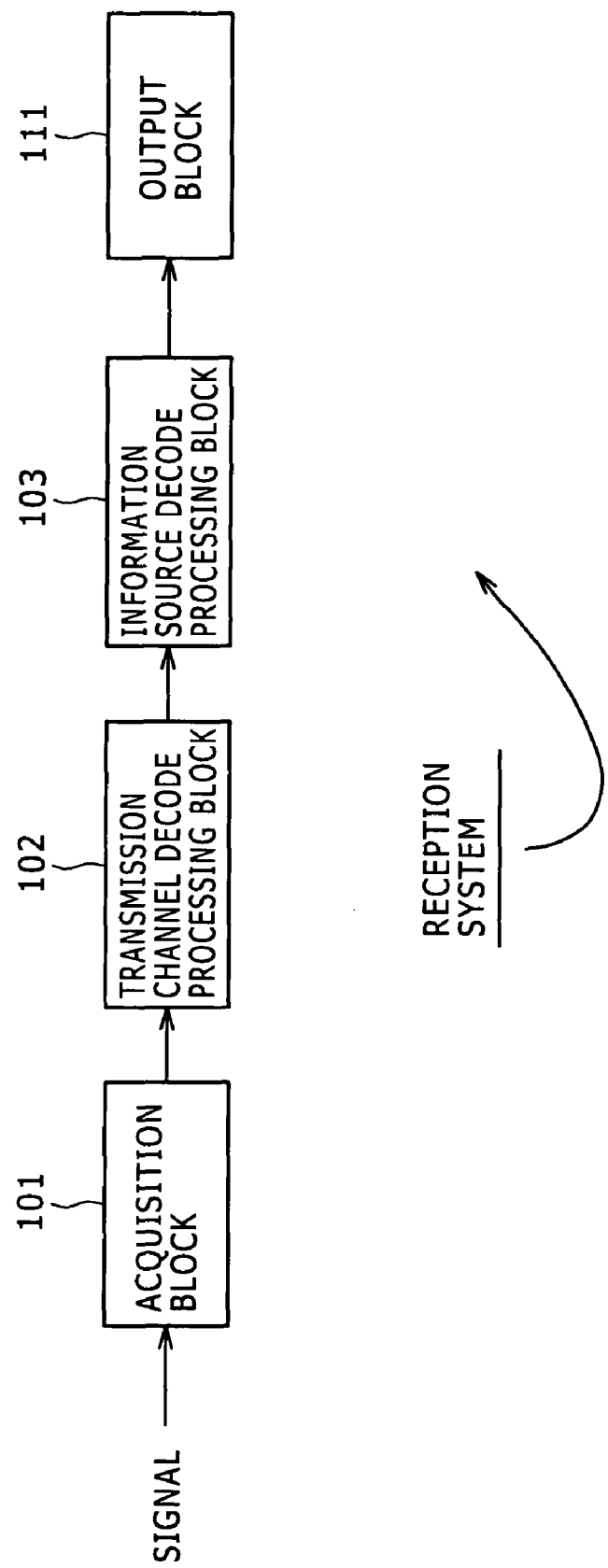
FIG. 8 is a block diagram showing a second structure example of the reception system.

FIG. 8 is a block diagram showing the second structure example of the reception system to which the frequency/phase synchronization circuit of the present invention is applied. In FIG. 8, the components with their functionally equivalent counterparts included in FIG. 7 are designated by like reference numerals, and their descriptions are omitted where redundant.

The structure of the reception system in FIG. 8 is common to the structure shown in FIG. 7 in that the system contains an acquisition block 101, a transmission channel decode processing block 102, and an information source decode processing block 103. The reception system in FIG. 8 is structurally different from that in FIG. 7 in that the system is furnished anew with an output block 111.

The output block 111 is illustratively composed of a display device for displaying images and/or speakers for outputting sounds. As such, the output block 111 outputs images and sounds represented by the signal output from the information source decode processing block 103. The output block 111 is a device that displays images and/or outputs sounds.

The reception system of FIG. 8 may be applied to TV sets that receive digital TV broadcasts or to radio receivers receiving radio broadcasts. If the signal acquired by the acquisition block 101 has not undergone compression coding earlier, then the signal output from the transmission channel decode processing block 102 is fed directly to the output block 111.

Figure 9:
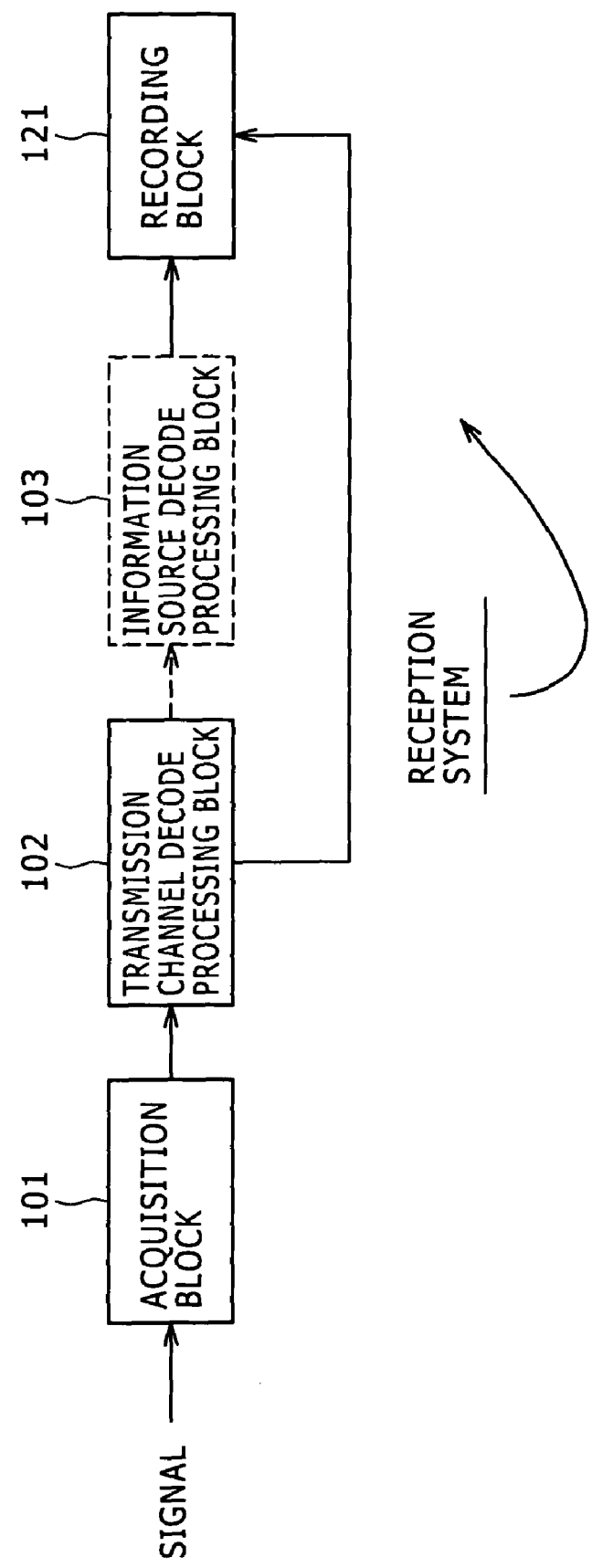
FIG. 9 is a block diagram showing a third structure example of the reception system.

FIG. 9 is a block diagram showing the third structure example of the reception system to which the frequency/phase synchronization circuit of the present invention is applied. In FIG. 9, the components with their functionally equivalent counterparts included in FIG. 7 are designated by like reference numerals, and their descriptions are omitted where redundant.

The structure of the reception system in FIG. 9 is common to the structure shown in FIG. 7 in that the system contains an acquisition block 101 and a transmission channel decode processing block 102. The reception system in FIG. 9 is structurally different from that in FIG. 7 in that the system is not furnished with the information source decode processing block 103 and is provided anew with a recording block 121.

The recording block 121 records (i.e., stores) the signal output from the transmission channel decode processing block 102 (e.g., the signal may be TS packets of MPEG transport streams) to recording (storage) media such as optical disks, hard disks (magnetic disks), or flash memories.

The above-described reception system of FIG. 9 may be applied illustratively to recorder devices that record TV broadcasts. As an alternative, the reception system may further include the information source decode processing block 103 so that the signal having undergone information source decode processing by the information source decode processing block 103, i.e., the images and sounds obtained through decoding, may be recorded by the recording block 121.

The series of the steps or processes described above may be executed either by hardware or by software. Where the steps or processes are to be carried out by software, the programs constituting the software may be either incorporated beforehand in the dedicated hardware of the computer to be used or installed from a suitable program recording medium into a general-purpose personal computer or like equipment.

FIG. 10 is a block diagram showing a typical structure of a computer that executes the above-mentioned series of steps or processes using programs. In FIG. 10, a CPU (central processing unit) 151, a ROM (read only memory) 152, and a RAM (random access memory) 153 are interconnected by a bus 154.

An input/output interface 155 is also connected to the bus 154. The input/output interface 155 is connected with an input block 156 typically made up of a keyboard and a mouse and with an output block 157 illustratively composed of a display and speakers. The input/output interface 155 is further connected with a storage block 158 typically formed by a hard disk or a nonvolatile memory, a communication block 159 illustratively constituted by a network interface, and a drive 160 that drives removable media 161.

In the computer of the structure outlined above, the CPU 151 carries out the above-described series of steps or processes illustratively by loading relevant programs from the storage block 158 into the RAM 153 for execution by way of the input/output interface 155 and bus 154.

The programs to be executed by the CPU 151 are installed into the storage block 158 after being distributed either recorded on the removable media 161 or transmitted through wired or wireless communication media such as local area networks, the Internet, or digital broadcasts.

Also, the programs for execution by the computer may be processed in the depicted sequence of this specification (i.e., on a time series basis), in parallel, or in otherwise appropriately timed fashion such as when they are invoked.

It should be understood by those skilled in the art that various modifications, combinations, sub-combinations and alterations may occur depending on design requirements and other factor in so far as they are within the scope of the appended claims or the equivalents thereof.

The present application contains subject matter related to that disclosed in Japanese Priority Patent Application JP 2009-132060 filed in the Japan Patent Office on Jun. 1, 2009, the entire content of which is hereby incorporated by reference.

What is claimed is:

1. A synchronization circuit comprising:
a first phase-locked loop circuit configured to output, based on a received signal being input, a first phase control signal representing a first phase control amount of said received signal;
a second phase-locked loop circuit configured to output, given the same input received signal as that input to said first phase-locked loop circuit, a second phase control signal representing a second phase control amount of said received signal;
a first output circuit configured to control a phase of said received signal based on said first phase control signal in order to output a first phase-controlled signal;
a second output circuit configured to control the phase of said received signal based on said second phase control signal in order to output a second phase-controlled signal;
a first detection circuit configured to detect a phase control error of said first phase-locked loop circuit based on the first phase-controlled signal output from said first output circuit;
a second detection circuit configured to detect a phase control error of said second phase-locked loop circuit based on the second phase-controlled signal output from said second output circuit; and
a control circuit configured such that if the phase control error of said first phase-locked loop circuit detected by said first detection circuit is larger than the phase control error of said second phase-locked loop circuit detected by said second detection circuit, then said control circuit sets a loop gain of a first loop filter included in said first phase-locked loop circuit to be the same as a loop gain of a second loop filter included in said second phase-locked loop circuit.

2. The synchronization circuit according to claim 1, wherein said first phase-locked loop circuit includes
the first detection circuit configured to detect a phase error remaining in the first phase-controlled signal;
the first loop filter configured to perform a filtering process on the phase control error detected by said first detection circuit;
a first oscillation circuit configured to output said first phase control signal in accordance with a result of said filtering process performed by said first loop filter; and
the first output circuit configured to control the phase of said received signal based on said first phase control signal output from said first oscillation circuit so as to output the first phase controlled signal to said first detection circuit as a signal targeted to be detected for phase error; and
said second phase-locked loop circuit includes
the second detection circuit configured to detect a phase error remaining in the second phase-controlled signal;
the second loop filter configured to perform a filtering process on the phase control error detected by said second detection circuit;
a second oscillation circuit configured to output said second phase control signal in accordance with a result of said filtering process performed by said second loop filter; and
the second output circuit configured to control the phase of said received signal based on said second phase control signal output from said second oscillation circuit so as to output the second phase-controlled signal to said second detection circuit as the signal targeted to be detected for phase error.

3. The synchronization circuit according to claim 2, wherein said first loop filter includes
a first multiplication circuit configured to multiply the phase error detected by said first detection circuit by a first loop gain;
a second multiplication circuit configured to multiply the phase error multiplied by said first multiplication circuit by a second loop gain; and
a first addition circuit configured to add up the phase error multiplied by said first multiplication circuit and the result of integrating the phase error multiplied by said second multiplication circuit, before outputting a sum of the errors to said first oscillation circuit; and
said second loop filter includes
a third multiplication circuit configured to multiply the phase error detected by said second detection circuit by a third loop gain;
a fourth multiplication circuit configured to multiply the phase error multiplied by said third multiplication circuit by a fourth loop gain; and
a second addition circuit configured to add up the phase error multiplied by said third multiplication circuit and the result of integrating the phase error multiplied by said fourth multiplication circuit, before outputting a sum of the errors to said second oscillation circuit.

4. The synchronization circuit according to claim 3, wherein said control circuit sets said first and said third loop gains to a different value each.

5. A synchronization method comprising the steps of:
based on a received signal being input, causing a first phase-locked loop circuit to output a first phase control signal representing a first phase control amount of said received signal;
given the same input received signal as that input to said first phase-locked loop circuit, causing a second phase-locked loop circuit to output a second phase control signal representing a second phase control amount of said received signal;

causing a first output circuit to control a phase of said received signal based on said first phase control signal in order to output a first phase-controlled signal;

causing a second output circuit to control the phase of said received signal based on said second phase control signal in order to output a second phase-controlled signal;

causing a first detection circuit to detect a phase control error of said first phase-locked loop circuit based on the first phase-controlled signal output from said first output circuit;

causing a second detection circuit to detect a phase control error of said second phase-locked loop circuit based on the second phase-controlled signal output from said second output circuit; and if the phase control error of said first phase-locked loop circuit detected by said first detection circuit is larger than the phase control error of said second phase-locked loop circuit detected by said second detection circuit, then setting a loop gain of a first loop filter included in said first phase-locked loop circuit to be the same as a loop gain of a second loop filter included in said second phase-locked loop circuit.

6. A reception system comprising:

acquisition means for acquiring a signal transmitted over a transmission channel; and transmission channel decode processing means for performing processing including a synchronous detection process on the signal acquired by said acquisition means;

wherein said transmission channel decode processing means includes a first phase-locked loop circuit configured to output, based on a received signal being input, a first phase control signal representing a first phase control amount of said received signal, a second phase-locked loop circuit configured to output, given the same input received signal as that input to said first phase-locked loop circuit, a second phase control signal representing a second phase control amount of said received signal, a first output circuit configured to control a phase of said received signal based on said first phase control signal in order to output a first phase-controlled signal, a second output circuit configured to control the phase of said received signal based on said second phase control signal in order to output a second phase-controlled signal, a first detection circuit configured to detect a phase control error of said first phase-locked loop circuit based on the first phase-controlled signal output from said first output circuit, a second detection circuit configured to detect a phase control error of said second phase-locked loop circuit based on the second phase-controlled signal output from said second output circuit, and a control circuit configured such that if the phase control error of said first phase-locked loop circuit detected by said first detection circuit is larger than the phase control error of said second phase-locked loop circuit detected by said second detection circuit, then said control circuit sets a loop gain of a first loop filter included in said first phase-locked loop circuit to be the same as a loop gain of a second loop filter included in said second phase-locked loop circuit.

7. A reception system comprising:

transmission channel decode processing means for performing processing including a synchronous detection process on a signal acquired over a transmission channel; and information source decode processing means for decoding data targeted to be transmitted from the signal processed by said transmission channel decode processing means;

wherein said transmission channel decode processing means includes a first phase-locked loop circuit configured to output, based on a received signal being input, a first phase control signal representing a first phase control amount of said received signal, a second phase-locked loop circuit configured to output, given the same input received signal as that input to said first phase-locked loop circuit, a second phase control signal representing a second phase control amount of said received signal, a first output circuit configured to control a phase of said received signal based on said first phase control signal in order to output a first phase-controlled signal, a second output circuit configured to control the phase of said received signal based on said second phase control signal in order to output a second phase-controlled signal, a first detection circuit configured to detect a phase control error of said first phase-locked loop circuit based on the first phase-controlled signal output from said first output circuit, a second detection circuit configured to detect a phase control error of said second phase-locked loop circuit based on the second phase-controlled signal output from said second output circuit, and a control circuit configured such that if the phase control error of said first phase-locked loop circuit detected by said first detection circuit is larger than the phase control error of said second phase-locked loop circuit detected by said second detection circuit, then said control circuit sets a loop gain of a first loop filter included in said first phase-locked loop circuit to be the same as a loop gain of a second loop filter included in said second phase-locked loop circuit.

8. A reception system comprising:

transmission channel decode processing means for performing processing including a synchronous detection process on a signal acquired over a transmission channel; and output means for outputting an image or a sound based on the signal processed by said transmission channel decode processing means;

wherein said transmission channel decode processing means includes a first phase-locked loop circuit configured to output, based on a received signal being input, a first phase control signal representing a first phase control amount of said received signal, a second phase-locked loop circuit configured to output, given the same input received signal as that input to said first phase-locked loop circuit, a second phase control signal representing a second phase control amount of said received signal, a first output circuit configured to control a phase of said received signal based on said first phase control signal in order to output a first phase-controlled signal, a second output circuit configured to control the phase of said received signal based on said second phase control signal in order to output a second phase-controlled signal, a first detection circuit configured to detect a phase control error of said first phase-locked loop circuit based on the first phase-controlled signal output from said first output circuit, a second detection circuit configured to detect a phase control error of said second phase-locked loop circuit based on the second phase-controlled signal output from said second output circuit, and a control circuit configured such that if the phase control error of said first phase-locked loop circuit detected by said first detection circuit is larger than the phase control error of said second phase-locked loop circuit detected by said second detection circuit, then said control circuit sets a loop gain of a first loop filter included in said first phase-locked loop circuit to be the same as a loop gain of a second loop filter included in said second phase-locked loop circuit.

9. A reception system comprising:

transmission channel decode processing means for performing processing including a synchronous detection process on a signal acquired over a transmission channel; and recording means for recording the signal processed by said transmission channel decode processing means;

wherein said transmission channel decode processing means includes a first phase-locked loop circuit configured to output, based on a received signal being input, a first phase control signal representing a first phase control amount of said received signal, a second phase-locked loop circuit configured to output, given the same input received signal as that input to said first phase-locked loop circuit, a second phase control signal representing a second phase control amount of said received signal, a first output circuit configured to control a phase of said received signal based on said first phase control signal in order to output a first phase-controlled signal, a second output circuit configured to control the phase of said received signal based on said second phase control signal in order to output a second phase-controlled signal, a first detection circuit configured to detect a phase control error of said first phase-locked loop circuit based on the first phase-controlled signal output from said first output circuit, a second detection circuit configured to detect a phase control error of said second phase-locked loop circuit based on the second phase-controlled signal output from said second output circuit, and a control circuit configured such that if the phase control error of said first phase-locked loop circuit detected by said first detection circuit is larger than the phase control error of said second phase-locked loop circuit detected by said second detection circuit, then said control circuit sets a loop gain of a first loop filter included in said first phase-locked loop circuit to be the same as a loop gain of a second loop filter included in said second phase-locked loop circuit.

* * * * *